United States Patent [19]
Butaud

[11] Patent Number: 6,034,881
[45] Date of Patent: *Mar. 7, 2000

[54] TRANSISTOR STACK READ ONLY MEMORY

[75] Inventor: Remi Butaud, Valbonne, France

[73] Assignee: VLSI Technology, Inc., San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/060,113

[22] Filed: Apr. 15, 1998

[51] Int. Cl.$^7$ ...................................................... G11C 7/00
[52] U.S. Cl. ................... 365/103; 365/104; 365/185.05; 365/189.02; 365/203
[58] Field of Search ..................................... 365/103, 104, 365/203, 185.05, 185.17, 189.02, 230.02

[56] References Cited

U.S. PATENT DOCUMENTS

| | | | |
|---|---|---|---|
| 4,980,861 | 12/1990 | Herdt et al. .......................... | 365/185.17 |
| 5,270,969 | 12/1993 | Iwahashi .............................. | 365/104 X |
| 5,434,814 | 7/1995 | Cho et al. ............................ | 365/104 X |
| 5,440,506 | 8/1995 | Longway et al. ...................... | 365/104 |
| 5,483,483 | 1/1996 | Choi et al. ........................... | 365/104 X |
| 5,596,526 | 1/1997 | Assar et al. .......................... | 365/104 X |
| 5,721,698 | 2/1998 | Lee et al. ............................. | 365/104 |
| 5,740,108 | 4/1998 | Okubo ................................ | 365/104 X |
| 5,812,450 | 9/1998 | Sansbury et al. ..................... | 365/104 X |
| 5,825,683 | 10/1998 | Chang ................................ | 365/104 |

*Primary Examiner*—Do Hyun Yoo
*Attorney, Agent, or Firm*—Burns Doane Swecker & Mathis L.L.P.

[57] ABSTRACT

The present invention, generally speaking, provides compact ROM layouts for trace or via-programmable (e.g., metal programmable) using transistor stacks. A number of field effect transistors (for example, eight) are coupled in series. For a particular transistor, a logic zero is programmed by forming a metal trace between the source and drain of the transistor. To read out the value of a particular bit, a logic zero is applied to the gate of the corresponding transistor. Logic ones are applied to the gates of the remaining transistors in the stack. A logic one precharge signal is applied to the top and bottom of the stack. A logic zero is then applied to the bottom of the stack. The logic zero reaches a sense amplifier coupled to the top of the transistor stack only if there is a short circuit across the transistor being read, indicating a logic zero bit value. Otherwise, the precharged logic one condition remains. Transistor stacks may be paired in a similar manner as individual transistors in conventional layouts. A very efficient ROM layout results.

6 Claims, 4 Drawing Sheets

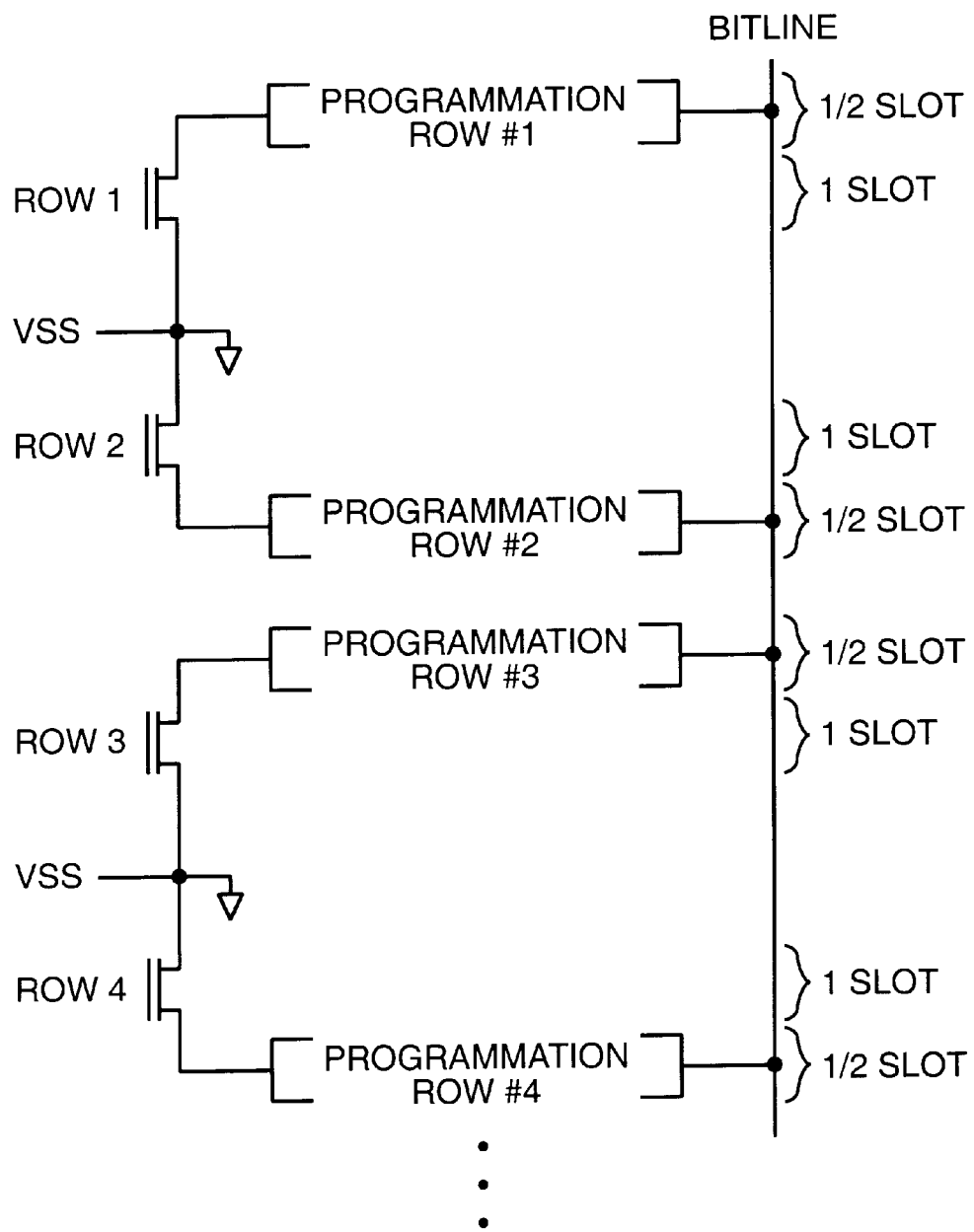
FIG._1
*(PRIOR ART)*

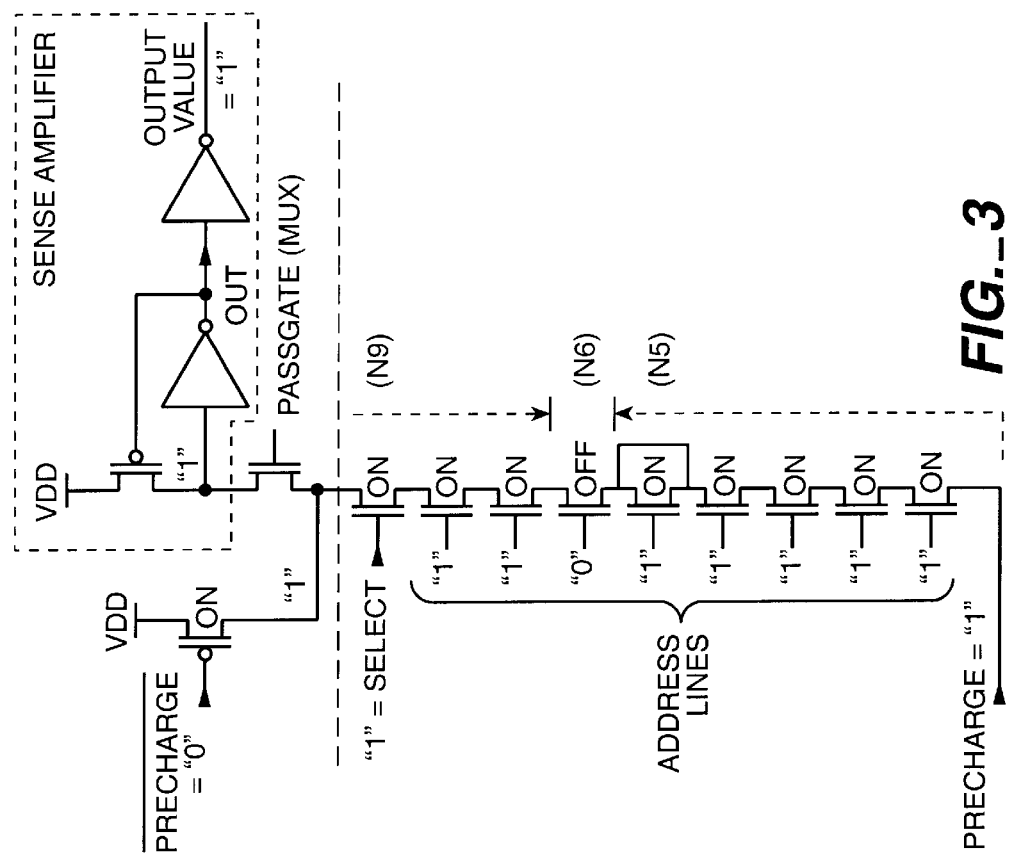
FIG._3
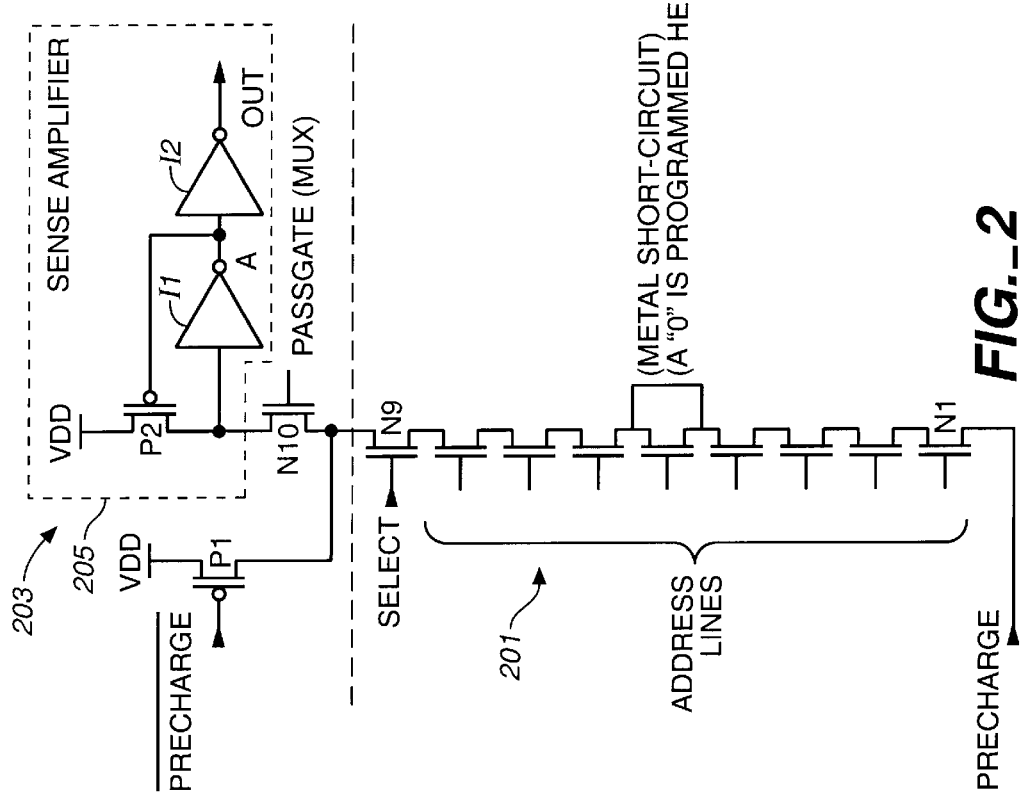
FIG._2

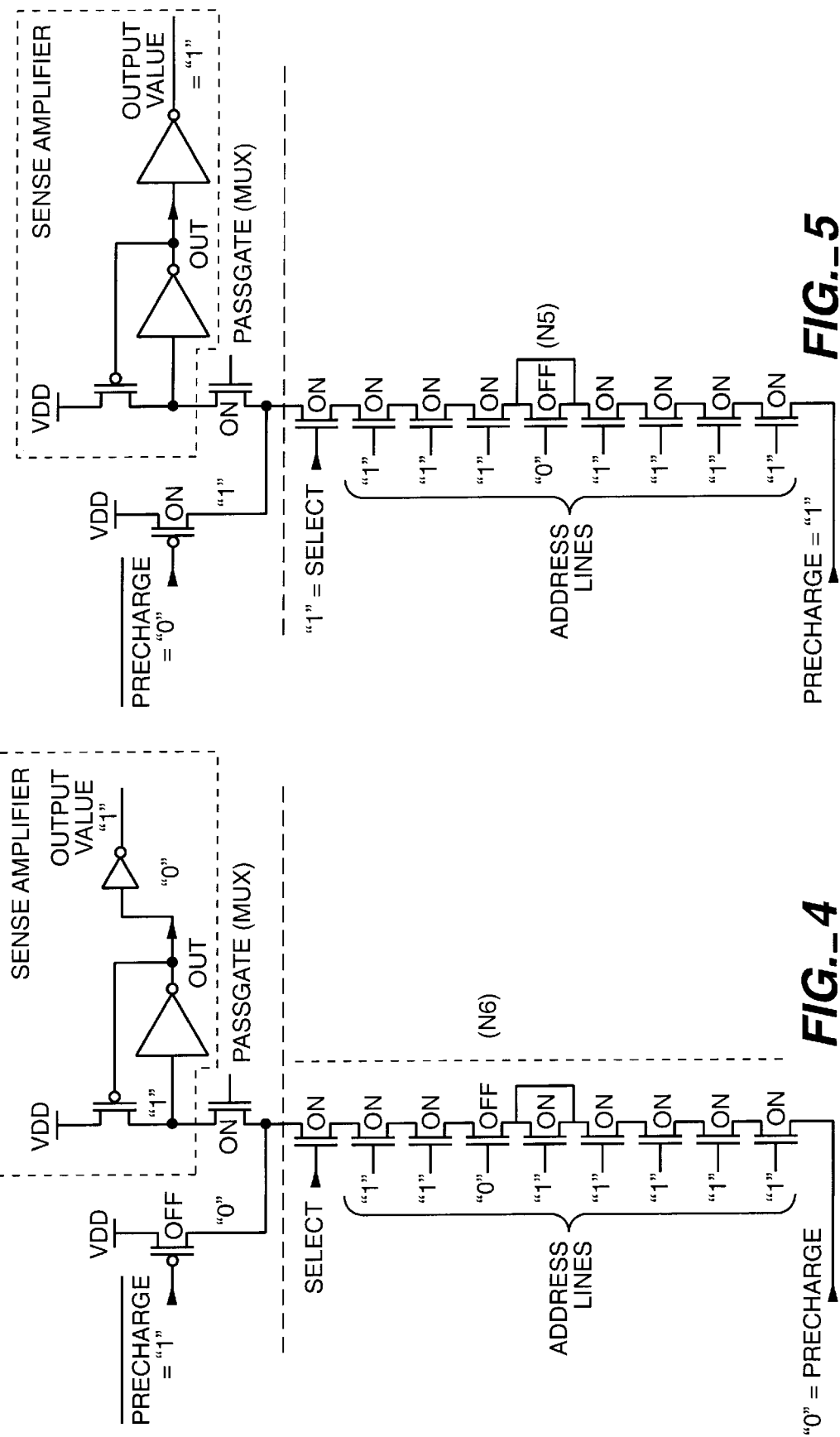

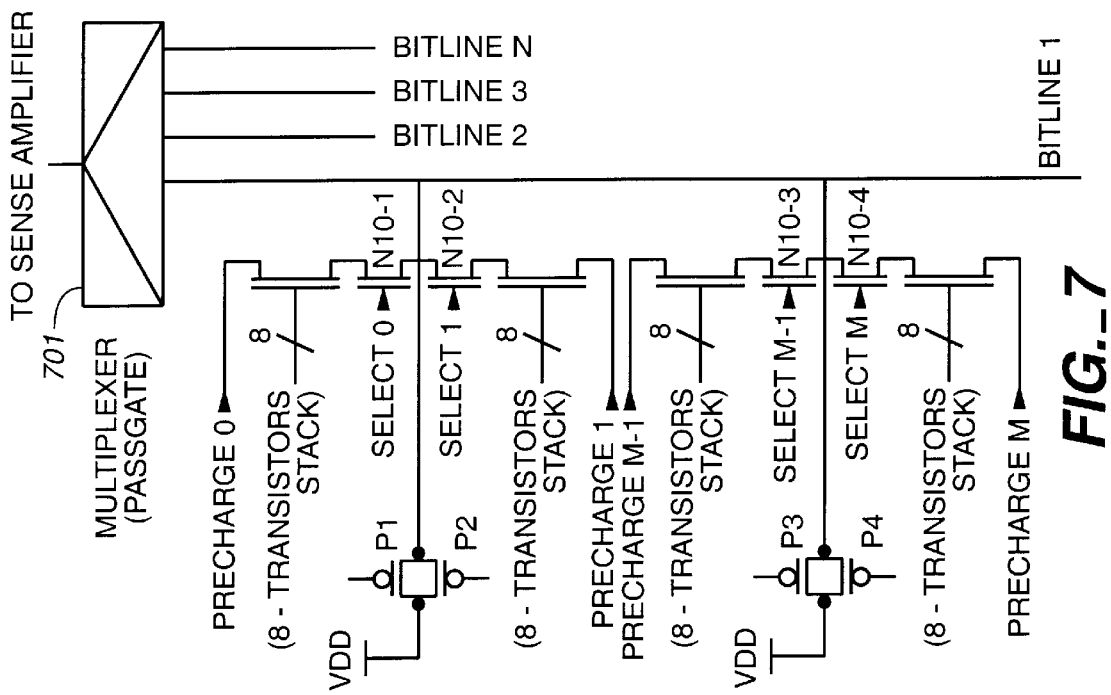
FIG._7
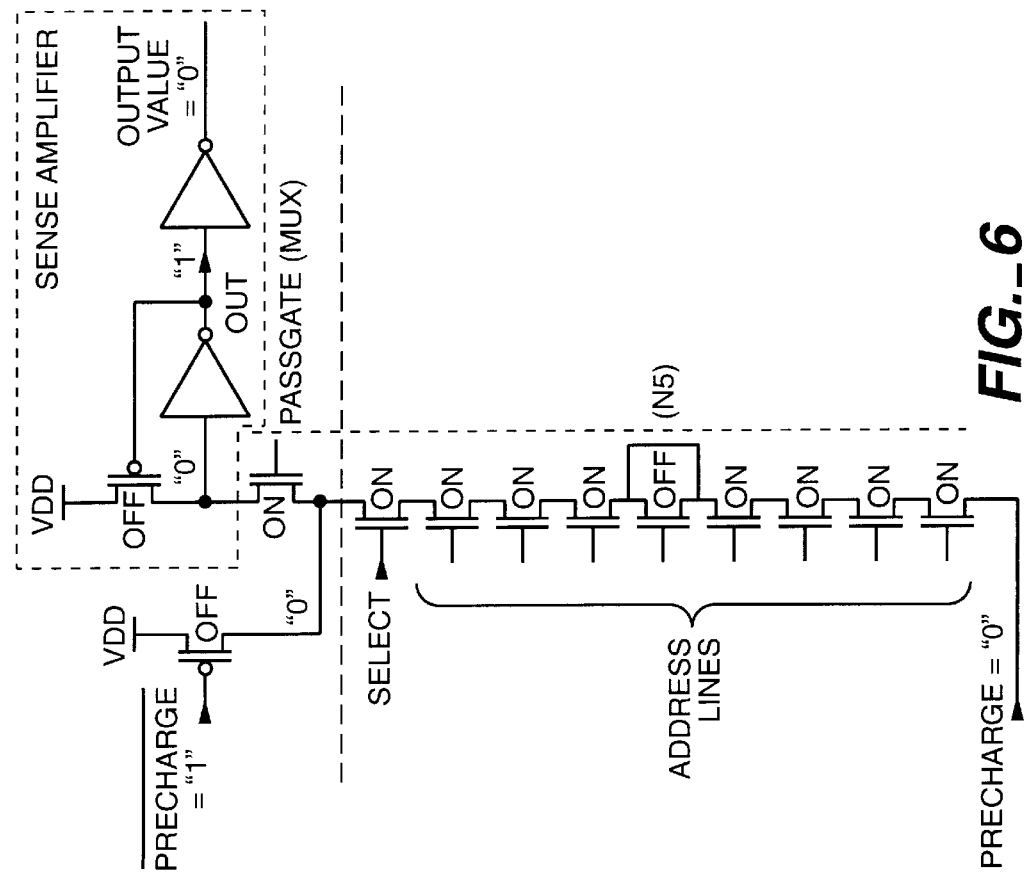
FIG._6

TRANSISTOR STACK READ ONLY MEMORY

BACKGROUND OF THE INVENTION

1. Field of the Invention

The present invention relates to trace or via-programmable, usually metal programmable, read only memories (ROMs), and more particularly to space-efficient layouts for ROMs of this type.

2. State of the Art

Read only memories are widely used in computers and electronic devices of various descriptions. Frequently, a ROM is incorporated within an Application Specific Integrated Circuit (ASIC). A ROM of a given capacity and word size is typically understood to require a given amount of space on an integrated circuit. Referring to FIG. 1 for example, in the case of a conventional metal-programmable parallel ROM architecture, transistors are connected in pairs to a working potential VSS and to a bitline. Each transistor stores a single bit of information. The existence of a conducting path between VSS and the bitline or the lack of such a conducting path determines for a given transistor whether a logic zero or a logic one is programmed. For every two bits of information, there is one VSS line. In a typical 0.35 µm process, the pitch of two transistors in series and the metal pitch are the same. The resulting overhead (lost space) due to VSS connections is therefore calculated as 1/(2+1)=33%.

The capacity and word size of a ROM are design requirements for a particular ASIC design, thereby fixing the amount of space required for the ROM. However, there may arise a need to accommodate additional circuitry on an ASIC including a ROM without increasing the die size of the ASIC. If the ROM could be compacted, or laid out more efficiently, then space on the integrated circuit would then be freed up for other circuitry for the same die cost (area). In other instances, compacting of the ROM may allow for a smaller die size and a more economical package to be used.

SUMMARY OF THE INVENTION

The present invention, generally speaking, provides compact ROM layouts for trace or via-programmable (e.g., metal programmable) using transistor stacks. A number of field effect transistors (for example, eight) are coupled in series. For a particular transistor, a logic zero is programmed by forming a metal trace between the source and drain of the transistor. To read out the value of a particular bit, a logic zero is applied to the gate of the corresponding transistor. Logic ones are applied to the gates of the remaining transistors in the stack. A logic one precharge signal is applied to the top and bottom of the stack. A logic zero is then applied to the bottom of the stack. The logic zero reaches a sense amplifier coupled to the top of the transistor stack only if there is a short circuit across the transistor being read, indicating a logic zero bit value. Otherwise, the precharged logic one condition remains. Transistor stacks may be paired in a similar manner as individual transistors in conventional layouts. A very efficient ROM layout results.

BRIEF DESCRIPTION OF THE DRAWING

The present invention may be further understood from the following description in conjunction with the appended drawing.

In the drawing:

FIG. 1 is a diagram of part of a conventional ROM;

FIG. 2 is a diagram of part of a ROM in accordance with the present invention;

FIG. 3 is a diagram like that of FIG. 2 illustrating a precharge phase during which a logic zero is applied to the gate of a particular transistor the programmed value of which is to be read;

FIG. 4 is a diagram like that of FIG. 3 illustrating the corresponding read phase;

FIG. 5 is a diagram like that of FIG. 3 with the exception that a different transistor is addressed, the transistor having a metal short circuit formed across it, indicative of a logic zero bit value;

FIG. 6 is a diagram like that of FIG. 5 illustrating the corresponding read phase; and FIG. 7 is a diagram of part of a ROM including multiple transistor stacks such as that of FIG. 2.

DETAILED DESCRIPTION OF THE PREFERRED EMBODIMENTS

Referring now to FIG. 2, a portion of a ROM having a layout in accordance with the present invention is shown. A "transistor stack" 201 is formed of some number of transistors, nine in the illustrated example, including eight programmed transistor and one additional select transistor. The transistors are FETs and are connected in series, source to drain. The source of the lowermost transistor N1 is connected to a precharge signal. The drain of the uppermost transistor N9 is connected to output circuitry 203. The gate of the uppermost transistor N9 is connected to a select signal. Gates of the remaining transistors are connected to respective address lines.

The output circuitry includes a sense amplifier 205, a passgate N10 (which may belong to a larger multiplexer) and a precharge gate P1. The sense amplifier includes a transistor P2 coupled to VDD and two cascaded inverting buffers I1 and I2. A node A between the two inverting buffers is coupled to the gate of the transistor P2, forming a feedback path. The passgate N10 is coupled between the sense amplifier and the drain of the transistor N9. The source of the precharge gate P1 is coupled to VDD, and the drain is coupled to the source of the transistor N10. A gate electrode of the precharge transistor P1 is coupled to the logical inverse of the precharge signal.

Referring to FIG. 3, during a precharge phase of operation, the precharge signal is pulled high. Logic ones are applied to all but one of the address lines, while a logic zero is applied to the remaining one, the associated bit level of which is to be read in the succeeding read phase. This occurs when the address to be read is selected, during the precharge phase. In the example of FIG. 3, a transistor N6 is to be read. The bit level of a transistor is programmed to a zero by forming a metal trace between source and drain, as in the case of the transistor N5. Otherwise, the bit level of the transistor remains a one. A logic one is applied to the gate of the transistor N9, selecting the transistor stack. Again, this occurs when the address to be read is selected, during the precharge phase. With the transistor stack in the condition shown in FIG. 3, the precharge signal (logic one) propagates from the bottom of the transistor stack upward through any transistors preceding the transistor to be read, the gate of which is held low causing the transistor to be off. At the same time, the inverse signal precharge causes a logic one to be applied to the top of the stack and to be propagated downward through the select transistor and through any transistors preceding the transistor to be read. With the passgate turned on, a logic one is input to and held in the sense amplifier by the action of a feedback loop.

Referring to FIG. 4, during a read portion of the cycle, the precharge signal is deasserted (becomes a logic zero). A logic zero propagates from the bottom of the stack through any transistors preceding the transistor to be read. The zero cannot propagate through the transistor to be read, because it is turned off. The zero may be able to propagate past the transistor to be read, but only if the transistor is programmed to a zero bit level by having its source and drain shorted by a metal trace. In the example of FIG. 4, the transistor to be read is programmed with a logic one. Hence, the logic zero from the bottom of the stack does not propagate through the transistor. The input to and output of the sense amplifier remains a logic one, the correct value.

Assume now that instead of transistor N6, transistor N5 is to be read. Referring to FIG. 5, a precharge cycle is executed as before, during which a logic one is input to and held in the sense amplifier.

As shown in FIG. 6, during the read cycle, the logic zero applied to the precharge line propagates up the transistor stack and past the transistor, which is programmed to a logic zero by the metal trace. A zero propagates all the way up the stack and is applied to and held in the sense amplifier. The sense amplifier therefore outputs a logic zero, the correct value.

Referring to FIG. 7, to form a memory array, m transistor stacks are coupled to each of n bitlines. For ease of illustration, the transistor stacks of only Bitline 1 are shown. The bitlines are selected between by a multiplexer 701, the output of which is input to a sense amplifier. To achieve maximum compaction, stacks are paired together in order to share a common bitline connection and a common connection to VDD through precharge transistors (P1/P2 and P3/P4). The source of the select transistor is connected to the equivalent source of the select transistor of the next stack. Hence, in FIG. 7, the sources of N10-1 and N10-2 are connected together, the sources of N10-3 and N10-4 are connected together, etc. To read a particular bit, the appropriate stack is selected, the transistor corresponding to the desired bit is addressed, the appropriate bitline is selected, and the precharge and read cycles described previously are performed.

An estimate of the compaction achieved by the ROM layout of FIG. 7 in comparison with the ROM layout of FIG. 1 may be arrived at as follows. In the illustrated example, each stack contains eight programmed transistors, one selection transistor and one precharge line. The resulting overhead may be calculated as 2/(8+2)=20%. For the particular implementation illustrated, 80% of the available area is occupied by usable information as compared to 66% for a conventional ROM layout. Hence, 20% more data may be stored in the same area.

It will be appreciated by those of ordinary skill in the art that the present invention may be embodied in other specific forms without departing from the spirit or essential character thereof. The presently described embodiments are therefore considered to be illustrative and not restrictive. The scope of the invention is indicated by the appended claims rather than the foregoing description, and all changes which come within the meaning and range of equivalents thereof are intended to be embraced therein.

What is claimed is:

1. A read only memory, comprising:

a first bitline;

a second bitline;

multiple transistor stacks coupled to each of the first and second bitlines, each transistor stack comprising at least four switching devices connected in series and having a single connection to an operating potential, some of the at least four switching devices being programmed by forming a metal short circuit across said some of the at least four switching devices wherein a conductive path is established across said some of the at least four switching devices; and amultiplexer coupled to the first and second bitlines and to a sense amplifier for selectively coupling one of the first and second bitlines to the sense amplifier.

2. The read only memory of claim 1 wherein said switching devices are FETs.

3. The read only memory of claim 2 wherein one logic level is stored by forming a conductive path from source to drain bypassing a channel of an FET.

4. The read only memory of claim 3 wherein each transistor stack comprises precharge circuitry, said precharge circuitry, during a precharge phase, applying a known logic signal to at least one of a top-most transistor and a bottom-most transistor in the stack.

5. The read only memory of claim 4 further comprising select circuitry coupled in series with the stack, and coupled to a first circuit node.

6. The read only memory of claim 5 wherein the precharge circuitry applies a known logic signal to the first circuit node.

* * * * *